US012748351B2

(12) United States Patent
Chang et al.

(10) Patent No.: US 12,748,351 B2
(45) Date of Patent: Sep. 29, 2026

(54) DIGITAL EXPOSURE SYSTEM

(71) Applicant: KOREA INSTITUTE OF MACHINERY & MATERIALS, Daejeon (KR)

(72) Inventors: Won Seok Chang, Daejeon (KR); Won-Sup Lee, Daejeon (KR); Hyunmin Cho, Daejeon (KR); Gee Hong Kim, Daejeon (KR); Hyung Jun Lim, Daejeon (KR)

(73) Assignee: KOREA INSTITUTE OF MACHINERY & MATERIALS, Daejeon (KR)

( * ) Notice: Subject to any disclaimer, the term of this patent is extended or adjusted under 35 U.S.C. 154(b) by 22 days.

(21) Appl. No.: 18/714,640

(22) PCT Filed: Nov. 17, 2022

(86) PCT No.: PCT/KR2022/018248

§ 371 (c)(1),
(2) Date: May 30, 2024

(87) PCT Pub. No.: WO2023/177039

PCT Pub. Date: Sep. 21, 2023

(65) Prior Publication Data

US 2025/0028247 A1 Jan. 23, 2025

(30) Foreign Application Priority Data

Mar. 16, 2022 (KR) ........................ 10-2022-0032884

(51) Int. Cl.
*G03F 7/20* (2006.01)

(52) U.S. Cl.
CPC .................................. *G03F 7/2008* (2013.01)

(58) Field of Classification Search
CPC ................. G03F 7/2008; G03F 7/2051; G03F 7/70275; G03F 7/70291; G03F 7/70358
See application file for complete search history.

(56) References Cited

U.S. PATENT DOCUMENTS

| | | | | |
|---|---|---|---|---|
| 2001/0043317 A1* | 11/2001 | Shinada | ................... H04N 1/12 | 355/41 |
| 2011/0188016 A1 | 8/2011 | De Jager et al. | | |

(Continued)

FOREIGN PATENT DOCUMENTS

| | | |
|---|---|---|
| JP | 2001194607 | 7/2001 |
| JP | 2004-056100 | 2/2004 |

(Continued)

OTHER PUBLICATIONS

Minsu Kang et al., "Submicrometer-scale pattern generation via maskless digital photolithography" Optica vol. 7, No. 12, pp. 1788-1795, Dec. 17, 2020.
EPO, Extended European Search Report of the corresponding European Patent Application No. 22932406.6., dated Feb. 11, 2026, total 9 pages.

*Primary Examiner* — Mesfin T Asfaw
(74) *Attorney, Agent, or Firm* — LEX IP MEISTER, PLLC

(57) ABSTRACT

A digital exposure system according to an exemplary embodiment of the present invention includes a light source that radiates light onto a substrate, a digital mirror device that forms a two-dimensional pattern image by selectively transmitting light emitted from the light source, an optical system that modulates the two-dimensional pattern image into a one-dimensional pattern image, and a substrate scanner that adjusts the position of the substrate to continuously project the one-dimensional pattern image onto a photosensitive layer on the substrate for scan exposure, and the two-dimensional pattern image has a uniform image in a
(Continued)

direction parallel with a scan direction for the substrate and has an image of a target pattern in a direction perpendicular to the scan direction for the substrate.

10 Claims, 12 Drawing Sheets

(56) References Cited

U.S. PATENT DOCUMENTS

| | | | | |
|---|---|---|---|---|
| 2011/0253425 | A1 | 10/2011 | Haase et al. | |
| 2013/0050669 | A1* | 2/2013 | Maeda | G02B 26/0833 355/67 |
| 2013/0050799 | A1 | 2/2013 | Stowe et al. | |
| 2017/0131176 | A1 | 5/2017 | Dai et al. | |

FOREIGN PATENT DOCUMENTS

| | | |
|---|---|---|
| JP | 2013-049269 | 3/2013 |
| JP | 2016-200808 | 12/2016 |
| KR | 10-2007-0078241 | 7/2007 |
| KR | 2010-0093696 | 8/2010 |
| KR | 10-2011-0020869 | 3/2011 |
| KR | 10-1158260 | 6/2012 |
| KR | 10-2016-0111524 | 9/2016 |
| KR | 10-2019-0054815 | 5/2019 |
| KR | 10-2019-0142766 | 12/2019 |
| WO | 2005081034 | 9/2005 |

* cited by examiner

DIGITAL EXPOSURE SYSTEM

CROSS-REFERENCE TO RELATED APPLICATION

This application claims priority to and the benefit of Korean Patent Application No. 10-2022-0032884 filed in the Korean Intellectual Property Office on Mar. 16, 2022, the entire contents of which are incorporated herein by reference.

BACKGROUND OF THE INVENTION

(a) Field of the Invention

The present invention relates to a digital exposure system, and more particularly, to a digital exposure system using a digital mirror device.

(b) Description of the Related Art

In general, a digital exposure process is a type of photolithography and is a technology for creating a desired pattern with a photoresist without a mask. This digital exposure process creates a pattern by reproducing pattern images by a digital device and projecting the pattern images onto a substrate by an imaging optical system such that a photosensitive material applied to the substrate is exposed to light. In this case, since the sizes of pattern images are smaller than the size of the substrate, a desired pattern is created over the entire substrate by performing the exposure process while changing the pattern images for individual positions of the substrate.

Digital exposure systems using digital devices such as digital mirror devices (DMDs) or spatial light modulators (SLMs) perform exposure processes by projecting two-dimensional pattern images formed by the digital mirror devices (DMDs) onto substrates through optical systems. Therefore, digital exposure systems using digital mirror devices (DMDs) are optimized for a step-and-repeat type of exposure processes due to the advantage of being able to project a two-dimensional pattern image at one time, and are actively applied to 3D printers and the like.

However, since the digital exposure systems using the digital mirror devices (DMDs) project a two-dimensional pattern image at one time, they are not suitable for a scan type of exposure processes. A roll-to-roll exposure process is an exposure method for continuously producing flexible substrates, and performs continuous exposure while transferring a flexible substrate rolled in the form of a roll. However, since the digital exposure systems using the digital mirror devices are optimized for the step-and-repeat type of exposure processes, it is difficult to apply them to a roll-to-roll exposure process of performing scan exposure while continuously transferring a roll. In addition, since the roll-to-roll exposure process is a method of performing exposure while transferring a flexible substrate having the form of a roll, in order to improve the accuracy of exposure, it is required to minimize deformation and vibration of rolls which are transferred, so the exposure process should be performed on the surface of a roll transfer drum where vibration of rolls is minimized. Therefore, it is difficult to apply the digital exposure systems using the digital mirror devices for projecting two-dimensional planar images for exposure to the roll-to-roll exposure process. In addition, since they project a two-dimensional pattern image at one time, it is difficult for them to cope with the curvatures of substrate surfaces. For this reason, it is difficult to apply the digital exposure systems using the digital mirror devices (DMDs) to exposure processes for high-performance semiconductor packages such as wafer level packages (WLPs) or panel level packages (PLPs) in which severe substrate warpage may occur.

SUMMARY OF THE INVENTION

The present invention attempts to solve the above-mentioned problems of the related art and provide a digital exposure system capable of performing digital exposure on a non-planar substrate in a scanning manner.

A digital exposure system according to an exemplary embodiment of the present invention includes a light source that radiates light onto a substrate, a digital mirror device that forms a two-dimensional pattern image by selectively transmitting light emitted from the light source, an optical system that modulates the two-dimensional pattern image into a one-dimensional pattern image, and a substrate scanner that adjusts the position of the substrate to continuously project the one-dimensional pattern image onto a photosensitive layer on the substrate for scan exposure, and the two-dimensional pattern image has a uniform image in a direction parallel with a scan direction for the substrate and has an image of a target pattern in a direction perpendicular to the scan direction for the substrate.

Further, the optical system may include a plurality of projection lenses, and a cylindrical lens that is positioned between the projection lenses and the substrate.

Furthermore, the two-dimensional pattern image may be focused in the direction parallel with the scan direction for the substrate, imaged in the direction perpendicular to the scan direction for the substrate, and modulated into the one-dimensional pattern image.

Also, the digital exposure system may further include a diffraction compensator that is installed in the optical system to compensate for light which is diffracted in the scan direction for the substrate.

Further, the diffraction compensator may be positioned between the plurality of projection lenses of the optical system.

Furthermore, the diffraction compensator may be installed so as to correspond to a focusing point between the plurality of projection lenses on which the light is focused.

Also, the diffraction compensator may include a slit or an iris.

Further, a focusing direction in which the two-dimensional pattern image is focused and the scan direction for the substrate may have a first inclination angle larger than 0° and smaller than 45°.

Furthermore, the digital mirror device may include a plurality of pixel mirrors which rotates on a pixel rotation axis, and the focusing direction in which the two-dimensional pattern image is focused and the pixel rotation axis may be parallel with each other.

In addition, the digital mirror device may include a plurality of pixel mirrors which rotates on a pixel rotation axis, and the focusing direction in which the two-dimensional pattern image is focused and the pixel rotation axis may have the first inclination angle.

The digital exposure system according to the exemplary embodiment of the present invention forms a two-dimensional pattern image, which has a uniform image in a substrate scan direction and has an image of a target pattern in a direction perpendicular to the substrate scan direction, by the digital mirror device, and modulates the two-dimensional pattern image into a one-dimensional pattern image by the optical system, and continuously projects the one-dimensional pattern image for scan exposure. Therefore, it can be applied to a scan type of digital exposure process to improve the productivity. Accordingly, the digital exposure system can be applied to a roll-to-roll type of digital exposure process.

Further, since it is possible to form a pattern on a substrate by continuously projecting a one-dimensional pattern image for scan exposure, it is possible to apply a digital exposure process to non-planar substrates.

DETAILED DESCRIPTION OF THE EMBODIMENTS

Figure 1:
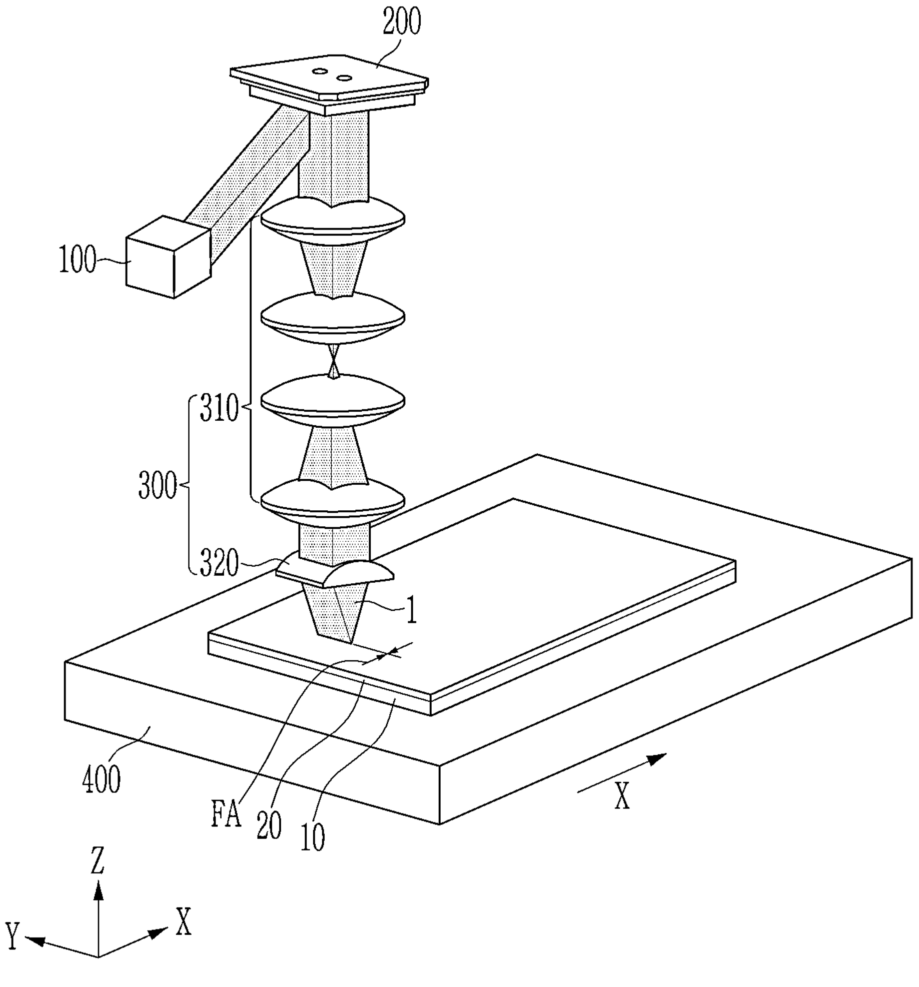
FIG. 1 is a schematic perspective view of a digital exposure system according to an exemplary embodiment of the present invention.

In the following detailed description, only certain exemplary embodiments of the present invention have been shown and described, simply by way of illustration. The present invention can be variously implemented and is not limited to the following exemplary embodiments.

The drawings and description are to be regarded as illustrative in nature and not restrictive. Like reference numerals designate like elements throughout the specification.

Now, a digital exposure system according to an exemplary embodiment of the present invention will be described in detail with reference to FIGS. 1 to 3.

Figure 2:
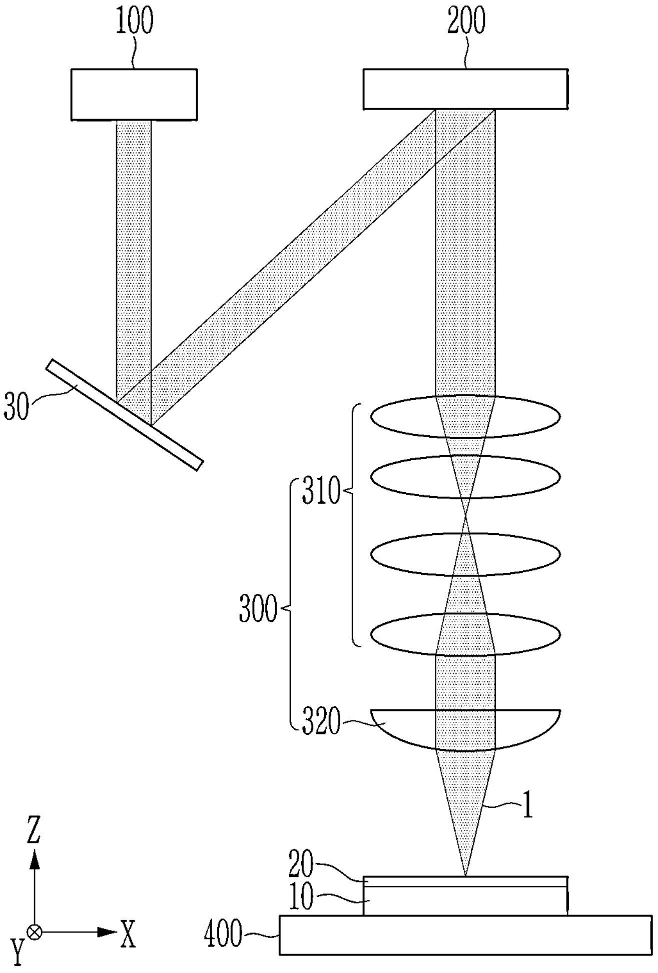
FIG. 2 is a schematic front view of the digital exposure system according to the exemplary embodiment of the present invention.
Figure 3:
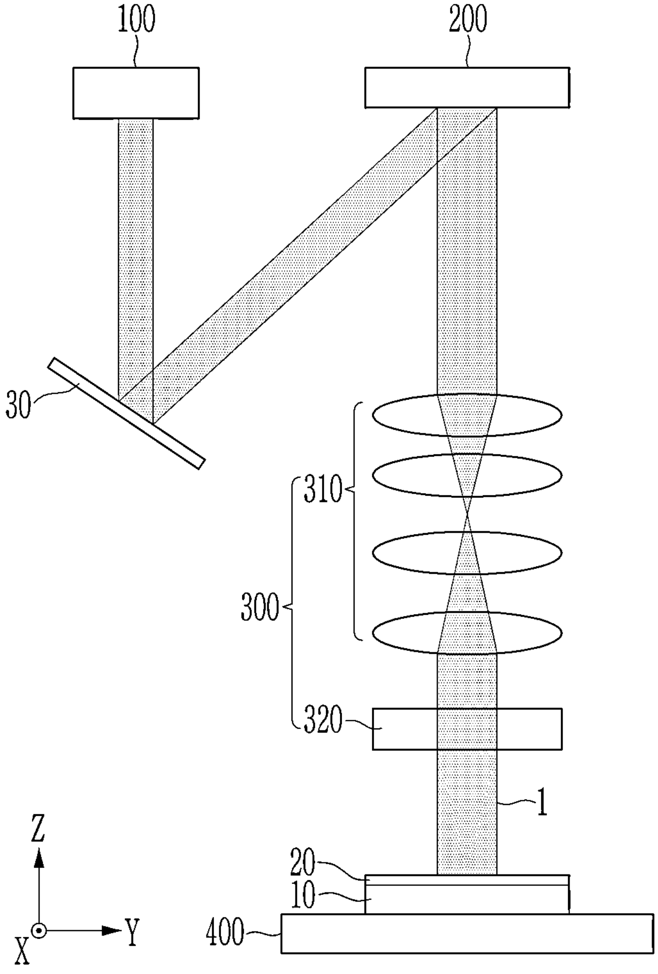
FIG. 3 is a schematic side view of the digital exposure system according to the exemplary embodiment of the present invention.

FIG. 1 is a schematic perspective view of the digital exposure system according to the exemplary embodiment of the present invention, FIG. 2 is a schematic front view of the digital exposure system according to the exemplary embodiment of the present invention, and FIG. 3 is a schematic side view of the digital exposure system according to the exemplary embodiment of the present invention.

As shown in FIGS. 1 to 3, the digital exposure system according to the exemplary embodiment of the present invention includes a light source 100, a digital mirror device 200, an optical system 300, and a substrate scanner 400.

The light source 100 may radiate light 1 onto a photosensitive layer 20 on a substrate 20. The light source 100 may include any one selected from LEDs, lamps, lasers, and the like. Light 1 which is radiated from the light source 100 may have various wavelengths of 365 nm, 435 nm, 405 nm, and the like. This light 1 which is radiated from the light source 100 may enter the digital mirror device 200 via a reflective member 30.

The digital mirror device 200 may selectively transmit the light 1 emitted from the light source 100 to form a two-dimensional pattern image PI.

Figure 4:
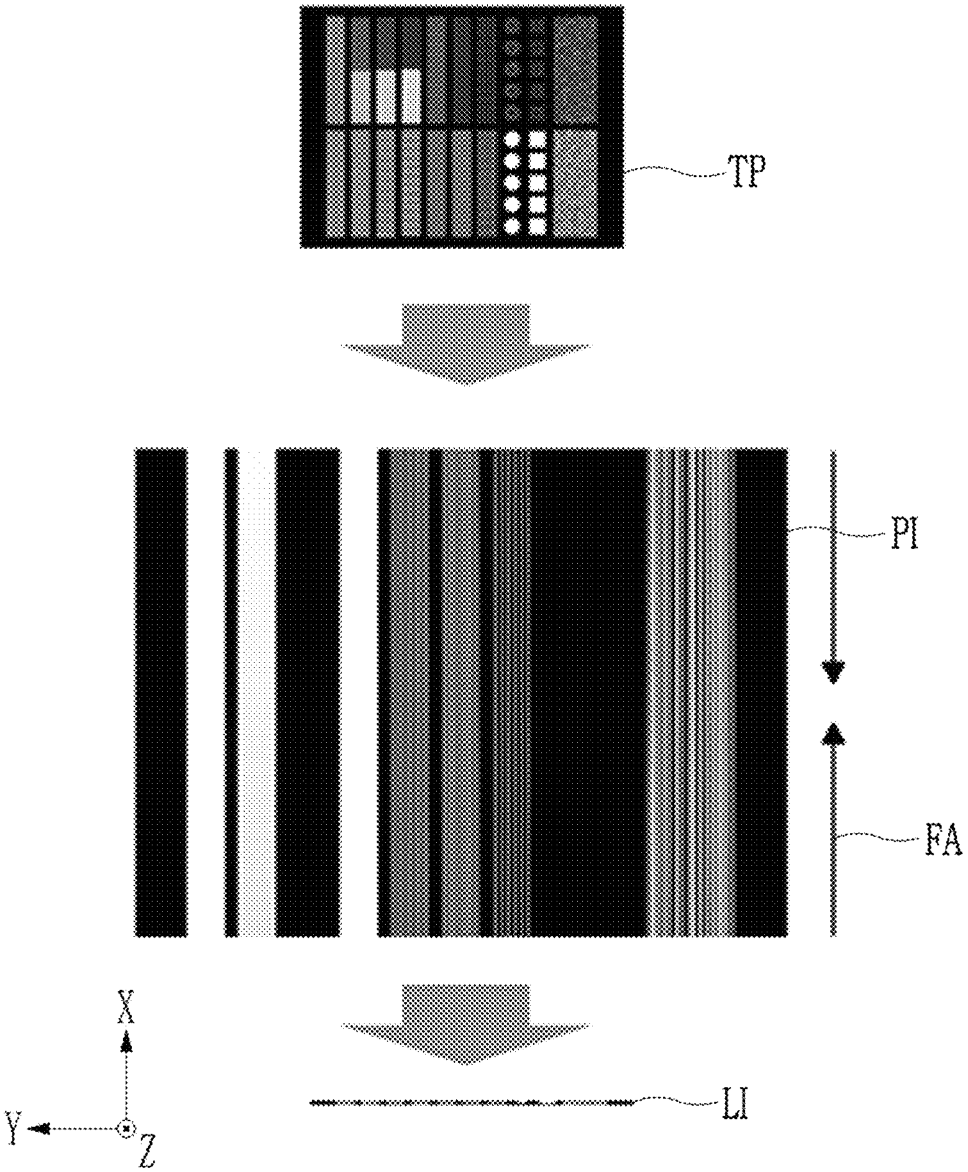
FIG. 4 is a view for explaining a situation in which the digital exposure system according to the exemplary embodiment of the present invention forms a two-dimensional pattern image and modulates the two-dimensional pattern image into a one-dimensional pattern image.

FIG. 4 is a view for explaining a situation in which the digital exposure system according to the exemplary embodiment of the present invention forms a two-dimensional pattern image and modulates the two-dimensional pattern image into a one-dimensional pattern image.

As shown in FIG. 4, a two-dimensional pattern image PI which is generated by the digital mirror device 200 may have a uniform image in a direction X parallel with a scan direction X for a substrate 10 and have an image of a target pattern TP in a direction Y perpendicular to the scan direction X for the substrate 10.

The optical system 300 may modulate the two-dimensional pattern image PI, generated by the digital mirror device 200, into a one-dimensional pattern image LI. The one-dimensional pattern image LI may have an image of the target pattern TP only in the direction Y perpendicular to the scan direction X for the substrate 10.

The optical system 300 may include a plurality of projection lenses 310, and a cylindrical lens 320 that is positioned on a light path between the projection lenses 310 and the substrate 10. The cylindrical lens 320 is an asymmetric lens, and by the optical system 300 including the asymmetric lens, the two-dimensional pattern image PI may be focused in the direction X parallel with the scan direction X for the substrate 10, imaged in the direction Y perpendicular to the scan direction X for the substrate 10, and modulated into the one-dimensional pattern image LI. Here, the focusing direction FA in which the two-dimensional pattern image PI is focused may be parallel with the scan direction X for the substrate 10. Accordingly, it is possible to project the one-dimensional pattern image LI with uniform light intensity onto the photosensitive layer 20 on the substrate 10.

The substrate scanner 400 may adjust the position of the substrate 10 such that the one-dimensional pattern image LI is continuously projected onto the photosensitive layer 20 on the substrate 10 for scan exposure. At this time, the digital mirror device 200 may change the one-dimensional pattern image LI at a rate equal to the moving speed of the substrate 10 in sync with the moving speed of the substrate 10, such that the desired target pattern TP is projected onto the photosensitive layer 20 of the substrate 10.

As described above, the digital exposure system according to the exemplary embodiment of the present invention may form the two-dimensional pattern image, which has a uniform image in a direction parallel with the substrate scan direction and has an image of the target pattern in a direction perpendicular to the substrate scan direction, by the digital mirror device, and project the desired target pattern TP onto the photosensitive layer 20 of the substrate 10 by the optical system by modulating the two-dimensional pattern image into the one-dimensional pattern image LI and changing the one-dimensional pattern image LI at a rate equal to the moving speed of the substrate 10. Accordingly, since the one-dimensional pattern image LI is continuously projected onto the photosensitive layer 20 of the substrate 10 for scan exposure, it is possible to apply the digital exposure system to a scan type of digital exposure process to improve the productivity. Accordingly, since it is possible to form a linear focus on the surface of a cylindrical drum for a roll-to-roll type of digital exposure process, it is possible to apply the digital exposure system to a roll-to-roll exposure process required to perform exposure on a curved surface.

Also, since it is a linear scan exposure process, rather than a step-and-repeat type of exposure process, it is possible to more accurately correct the pattern in real time for each scan position. Accordingly, it is also possible to apply the digital exposure system to exposure processes for high-performance semiconductor packages such as wafer level packages (WLPs) or panel level packages (PLPs) in which severe substrate warpage may occur.

Meanwhile, other exemplary embodiments are possible in which a diffraction compensator capable of compensating for light which is diffracted in the substrate scan direction is additionally included, unlike the above-mentioned exemplary embodiment.

Hereinafter, a digital exposure system according to another exemplary embodiment of the present invention will be described in detail with reference to FIGS. 5 to 7.

Figure 5:
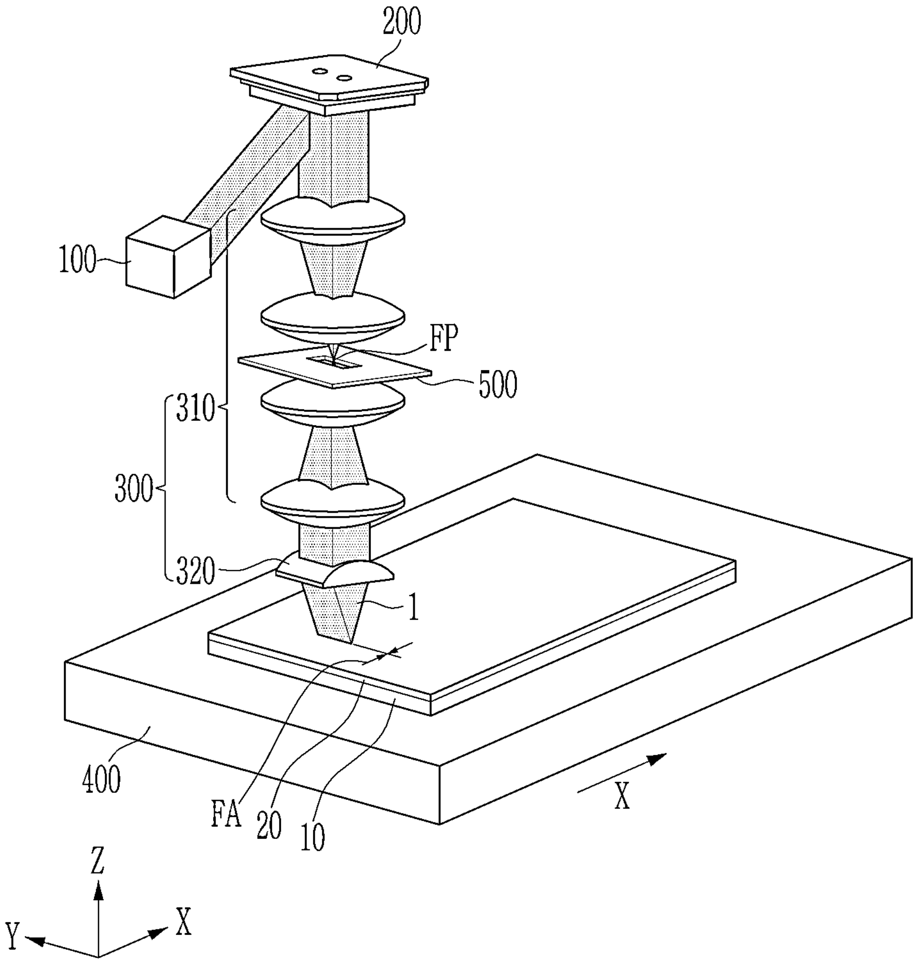
FIG. 5 is a schematic perspective view of a digital exposure system according to another exemplary embodiment of the present invention.
Figure 6:
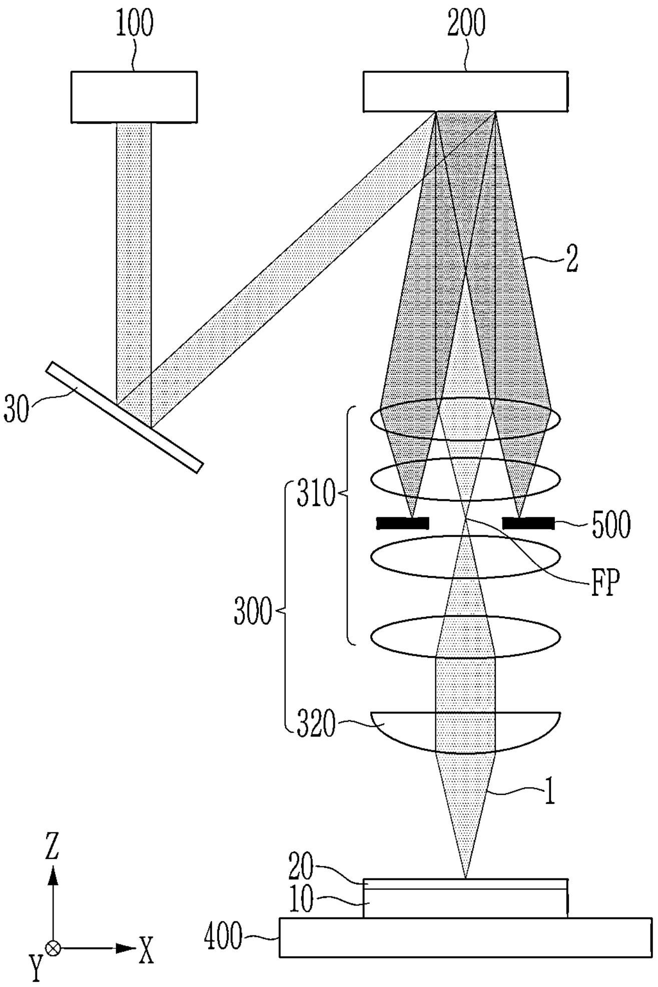
FIG. 6 is a schematic front view of the digital exposure system according to another exemplary embodiment of the present invention.
Figure 7:
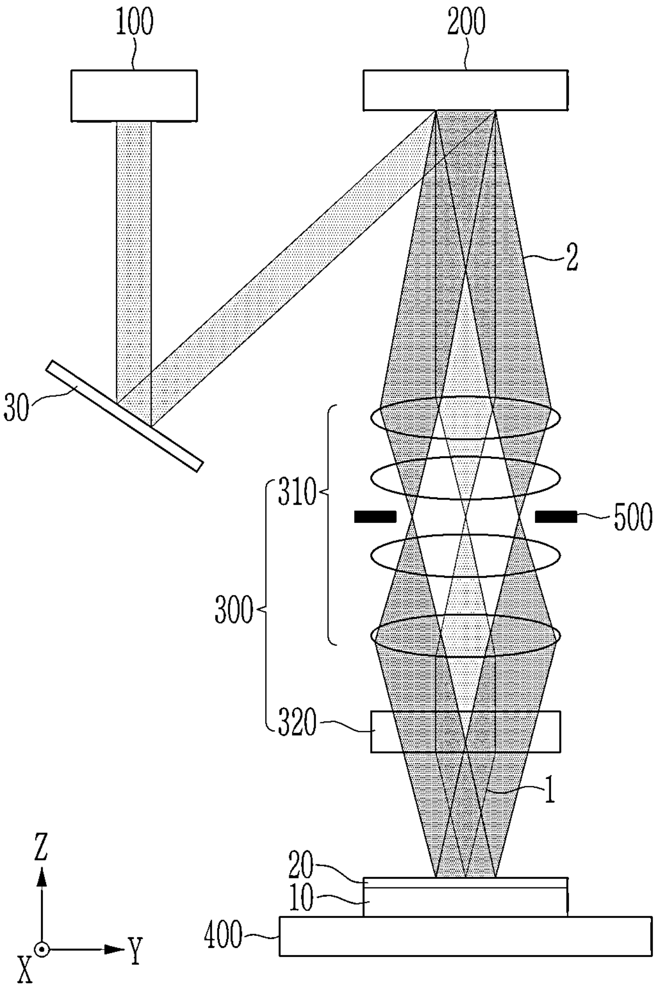
FIG. 7 is a schematic side view of the digital exposure system according to another exemplary embodiment of the present invention.

FIG. 5 is a schematic perspective view of a digital exposure system according to another exemplary embodiment of the present invention, FIG. 6 is a schematic front view of the digital exposure system according to another exemplary embodiment of the present invention, and FIG. 7 is a schematic side view of the digital exposure system according to another exemplary embodiment of the present invention.

Another exemplary embodiment shown in FIGS. 5 to 7 is substantially identical to the exemplary embodiment shown in FIGS. 1 to 4 except for a diffraction compensator, and thus a redundant description will not be made.

As shown in FIGS. 5 to 7, the digital exposure system according to another exemplary embodiment of the present invention includes a light source 100, a digital mirror device 200, an optical system 300, a substrate scanner 400, and a diffraction compensator 500.

The diffraction compensator 500 may be installed in the optical system 300 to compensate for light which is diffracted in the scan direction X for a substrate 10.

When the light source 100 uses a coherent light source such as a laser, light 1 passing through the digital mirror device is diffracted, whereby diffracted light 2 is generated. Accordingly, the light may be defocused, thereby causing multiple images to be formed. For this reason, the diffraction compensator 500 may be used to block the zero-order or higher order diffracted light 2 to form a clear one-dimensional linear image.

The diffraction compensator 500 may be positioned between the plurality of projection lenses 310. This diffraction compensator 500 may be installed so as to correspond to a focusing point FP between the plurality of projection lenses 310 on which the light 1 is focused.

The diffraction compensator 500 may include a slit extending in the direction Y perpendicular to the scan direction X for the substrate 10. Accordingly, it is possible to block high-order diffracted light diffracting in the scan direction X for the substrate 10 to form a clear one-dimensional linear image.

However, the diffraction compensator 500 may not necessarily be limited thereto, and the diffraction compensator 500 may include an iris. The iris may block not only high-order diffracted light diffracting in the scan direction X for the substrate 10 but also high-order diffracted light diffracting in the direction Y perpendicular to the scan direction X for the substrate 10.

Meanwhile, in the above-mentioned exemplary embodiment, the digital mirror device is disposed such that the two-dimensional pattern image focusing direction and the substrate scan direction are parallel with each other; however, other exemplary embodiments are possible in which a digital mirror device is disposed such that a two-dimensional pattern image focusing direction and a substrate scan direction have a predetermined inclination angle.

Hereinafter, a digital exposure system according to another exemplary embodiment of the present invention will be described in detail with reference to FIGS. 8 and 9.

Figure 8:
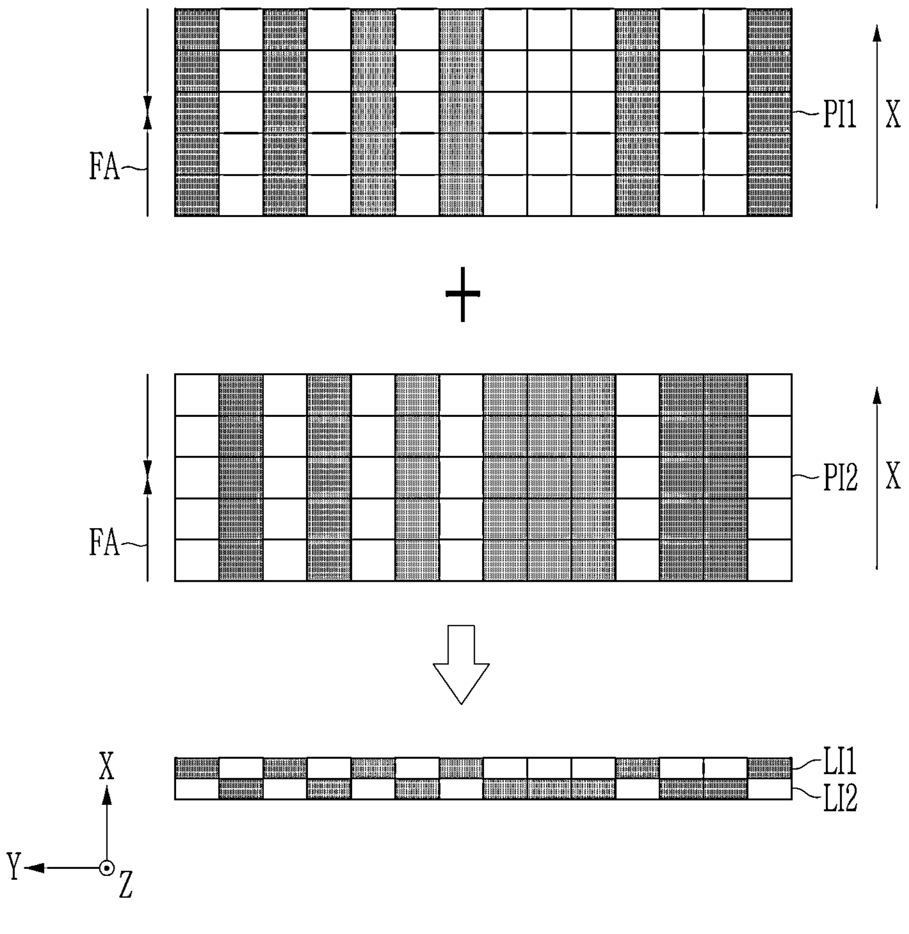
FIG. 8 is a view for explaining a state where the two-dimensional pattern image focusing direction and substrate scan direction of the digital exposure system according to the exemplary embodiment of the present invention are parallel with each other.
Figure 9:
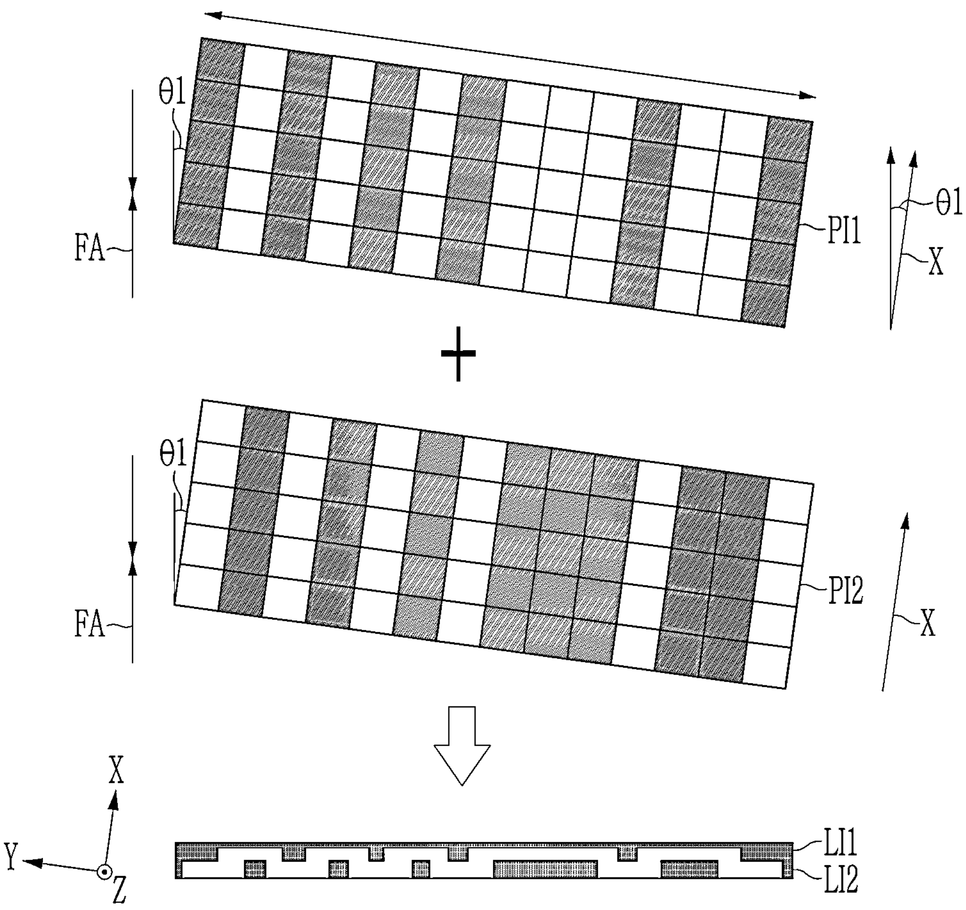
FIG. 9 is a view for explaining a state where the two-dimensional pattern image focusing direction and substrate scan direction of a digital exposure system according to another exemplary embodiment of the present invention have a first inclination angle larger than 0° and smaller than 45°.

FIG. 8 is a view for explaining a state where the two-dimensional pattern image focusing direction and substrate scan direction of the digital exposure system according to the exemplary embodiment of the present invention are parallel with each other, and FIG. 9 is a view for explaining a state where the two-dimensional pattern image focusing direction and substrate scan direction of the digital exposure system according to another exemplary embodiment of the present invention have a first inclination angle larger than 0° and smaller than 45°.

Another exemplary embodiment shown in FIG. 9 is substantially identical to the exemplary embodiment shown in FIGS. 1 to 4 and FIG. 8 except for the orientation of a digital mirror device, and thus a redundant description will not be made.

As shown in FIG. 8, in the digital exposure system according to the exemplary embodiment of the present invention, the focusing direction FA in which two-dimensional pattern images PI1 and PI2 are focused and the scan direction X for a substrate 10 may be parallel with each other. In this case, since pixels which are on and pixels which are off are clearly separated in each of a one-dimensional pattern image LI1 in the first row and a one-dimensional pattern image LI2 in the second row, it is difficult to project a continuous target pattern.

However, as shown in FIG. 9, in the digital exposure system according to another exemplary embodiment of the present invention, the digital mirror device 200 may be disposed such that the focusing direction FA in which the two-dimensional pattern images PI1 and PI2 are focused and the scan direction X for the substrate 10 have a first inclination angle q1 larger than 0° and smaller than 45°. In this case, since pixels which are on and pixels which are off are connected to each other without being clearly separated from each other in each of a one-dimensional pattern image LI1 in the first row and a one-dimensional pattern image LI2 in the second row, it is also possible to project a continuous target pattern.

Meanwhile, other exemplary embodiments are possible in which a digital mirror device is disposed such that a focusing direction in which a two-dimensional pattern image is focused and the pixel rotation axis of the digital mirror device are parallel with each other, unlike another exemplary embodiment shown in FIGS. 5 to 7.

Hereinafter, digital exposure systems according to other exemplary embodiments of the present invention will be described in detail with reference to FIGS. 10 and 11.

Figure 10:
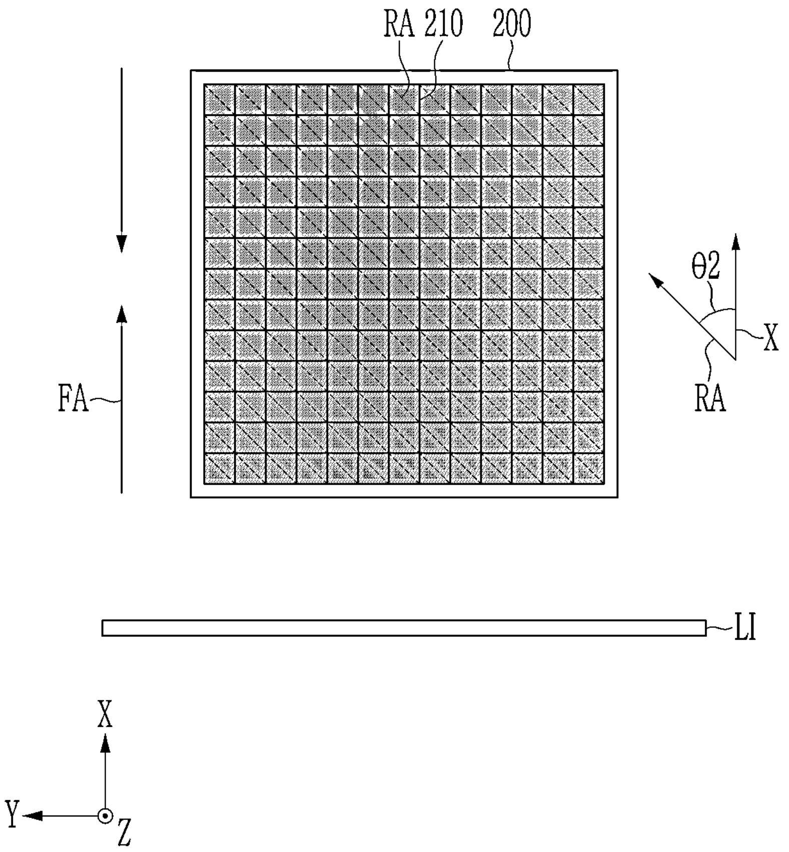
FIG. 10 is a view for explaining a state where the two-dimensional pattern image focusing direction of a digital exposure system according to another exemplary embodiment of the present invention and the pixel rotation axis of a digital mirror device are perpendicular to each other.
Figure 11:
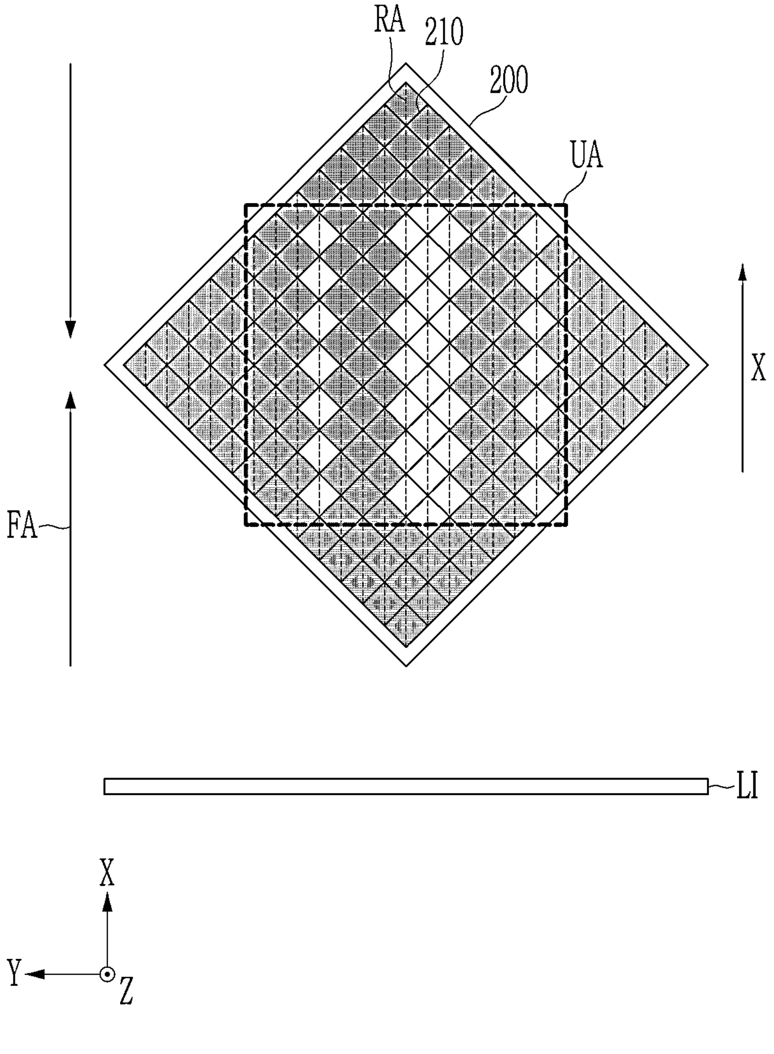
FIG. 11 is a view for explaining a state where the two-dimensional pattern image focusing direction of a digital exposure system according to another exemplary embodiment of the present invention and the pixel rotation axis of a digital mirror device are parallel with each other.

FIG. 10 is a view for explaining a state where the two-dimensional pattern image focusing direction of a digital exposure system according to another exemplary embodiment of the present invention and the pixel rotation axis of a digital mirror device are perpendicular to each other, and FIG. 11 is a view for explaining a state where the two-dimensional pattern image focusing direction of a digital exposure system according to another exemplary embodiment of the present invention and the pixel rotation axis of a digital mirror device are parallel with each other.

Another exemplary embodiment shown in FIG. 11 is substantially identical to another exemplary embodiment shown in FIGS. 5 to 7 except for the orientation of a digital mirror device, and thus, a redundant description will not be made.

As shown in FIG. 10, a digital mirror device 200 of a digital exposure system according to an exemplary embodiment of the present invention may include a plurality of pixel mirrors 210 which rotates on a pixel rotation axis RA. The digital mirror device 200 may reflect light by rotating the plurality of pixel mirrors 210 arranged in a matrix on the pixel rotation axis RA, thereby forming a two-dimensional pattern image PI.

In this case, when the focusing direction FA of the two-dimensional pattern image PI and the scan direction X for a substrate 10 are parallel with each other, the focusing direction FA of the two-dimensional pattern image PI and the pixel rotation axis RA may have a second inclination angle q2 with respect to each other by the orientations of the digital mirror device 200 and the substrate 10. In this case, a step may occur between the plurality of pixel mirrors 210, resulting in a degradation in the clarity of one-dimensional pattern images LI.

However, as shown in FIG. 11, when the focusing direction FA of a two-dimensional pattern image PI of a digital exposure system according to another exemplary embodiment of the present invention and the scan direction X for a substrate 10 are parallel with each other, the focusing direction FA of the two-dimensional pattern image PI and the pixel rotation axis RA may be parallel with each other. In this case, since any step does not occur between the plurality of pixel mirrors 210, the clarity of one-dimensional pattern images LI can be improved.

Further, since the digital exposure system according to another exemplary embodiment of the present invention includes the diffraction compensator 500, it is possible to block the zero-order or higher order diffracted light 2 to form clear one-dimensional linear images. In this case, since high-order diffracted light 2 caused by some of the plurality of pixel mirrors 210 is blocked by the diffraction compensator 500, it is possible to use only the pixel mirrors 210 positioned in the center area UA among the plurality of pixel mirrors 210. Accordingly, of light which is emitted from the light source 100, only light corresponding to the pixel mirrors 210 positioned in the center area UA may be emitted. Therefore, it is possible to minimize the exposure energy to be used.

Meanwhile, other exemplary embodiments are possible in which a digital mirror device is disposed such that while a two-dimensional pattern image focusing direction and a substrate scan direction have a first inclination angle larger than 0° and smaller than 45°, a focusing direction in which a two-dimensional pattern image is focused and the pixel rotation axis of the digital mirror device have the first inclination angle, unlike another exemplary embodiment shown in FIG. 11.

Hereinafter, a digital exposure system according to another exemplary embodiment of the present invention will be described in detail with reference to FIG. 12.

Figure 12:
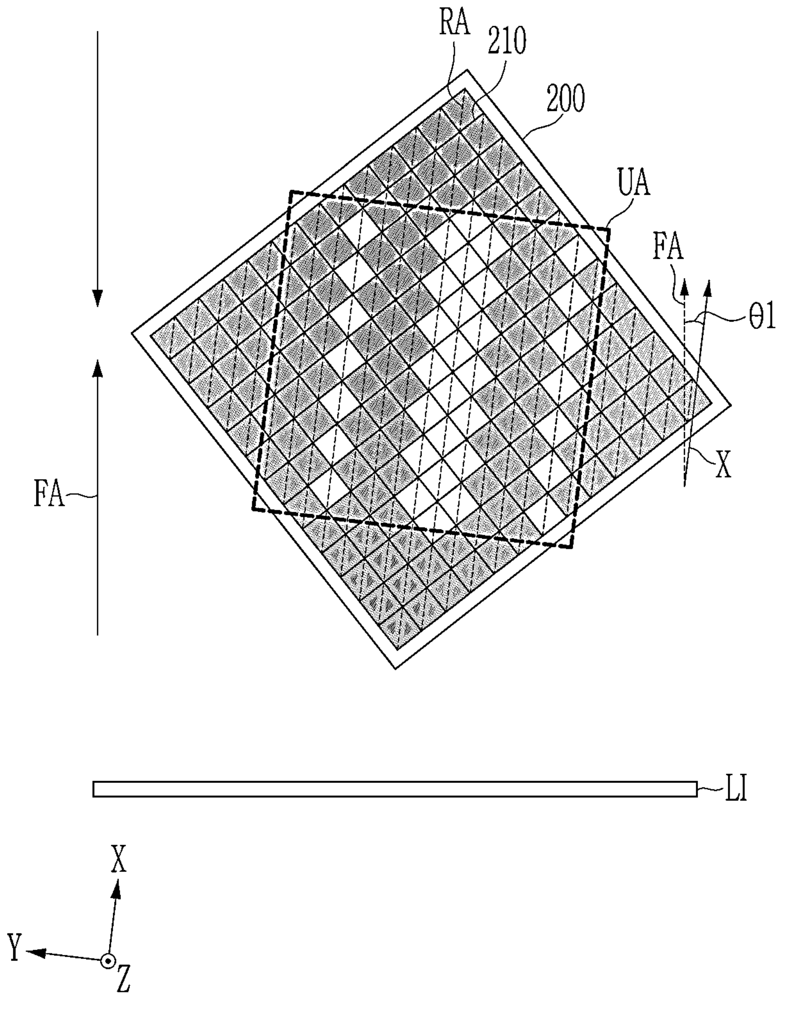
FIG. 12 is a view for explaining a state where while the two-dimensional pattern image focusing direction and substrate scan direction of a digital exposure system according to another exemplary embodiment of the present invention have the first inclination angle larger than 0° and smaller than 45°, the two-dimensional pattern image focusing direction and the pixel rotation axis of the digital mirror device have the first inclination angle.

FIG. 12 is a view for explaining a state where while the two-dimensional pattern image focusing direction and substrate scan direction of a digital exposure system according to another exemplary embodiment of the present invention have the first inclination angle larger than 0° and smaller than 45°, the two-dimensional pattern image focusing direction and the pixel rotation axis of the digital mirror device have the first inclination angle.

Another exemplary embodiment shown in FIG. 12 is substantially identical to another exemplary embodiment shown in FIG. 11 except for the orientation of a digital mirror device, and thus a redundant description will not be made.

As shown in FIG. 12, the focusing direction FA of a two-dimensional pattern image PI of a digital exposure system according to an exemplary embodiment of the present invention and a scan direction X for a substrate 10 may have a first inclination angle q1 larger than 0° and smaller than 45°. In this case, pixels which are on and pixels which are off may be connected to each other without being clearly separated from each other in adjacent one-dimensional pattern images LI. Therefore, it is also possible to project a continuous target pattern.

Also, the focusing direction FA of the two-dimensional pattern image PI and the pixel rotation axis RA of the digital mirror device may have the first inclination angle q1. In this case, since a step is minimized between the plurality of pixel mirrors 210, it is possible to minimize a degradation in the clarity of one-dimensional pattern images LI.

While this invention has been described in connection with what is presently considered to be practical exemplary embodiments, those skilled in the art will easily understood that the invention is not limited to the disclosed exemplary embodiments, and it is possible to make various modifications and equivalent arrangements without departing from the spirit and scope of the appended claims.

DESCRIPTION OF SYMBOLS

*64100: Light source
200: Digital mirror device

210: Pixel mirror
300: Optical system
400: Substrate scanner
500: Diffraction compensator

What is claimed is:

1. A digital exposure system comprising:
a light source that radiates light onto a substrate;
a digital mirror device that forms a two-dimensional pattern image by selectively transmitting light emitted from the light source;
an optical system that modulates the two-dimensional pattern image into a one-dimensional pattern image; and
a substrate scanner that adjusts the position of the substrate to continuously project the one-dimensional pattern image onto a photosensitive layer on the substrate for scan exposure,
wherein the two-dimensional pattern image has a uniform image in a direction parallel with a scan direction for the substrate and has an image of a target pattern in a direction perpendicular to the scan direction for the substrate,
wherein the optical system modulates the two-dimensional pattern image into the one-dimensional pattern image by imaging the two-dimensional pattern image in a direction perpendicular to the scan direction for the substrate, and
wherein an inclination angle between a focusing direction in which the two-dimensional pattern image is focused and the scan direction for the substrate is larger than 0° and smaller than 45°.

2. The digital exposure system of claim 1, wherein:
the optical system includes the following:
a plurality of projection lenses; and
a cylindrical lens that is positioned between the projection lenses and the substrate.

3. The digital exposure system of claim 1, further comprising:
a diffraction compensator that is installed in the optical system to compensate for light which is diffracted in the scan direction for the substrate.

4. The digital exposure system of claim 3, wherein:
the diffraction compensator is positioned between the plurality of projection lenses of the optical system.

5. The digital exposure system of claim 4, wherein:
the diffraction compensator is installed so as to correspond to a focusing point between the plurality of projection lenses on which the light is focused.

6. The digital exposure system of claim 3, wherein:
the diffraction compensator includes a slit or an iris.

7. The digital exposure system of claim 1, wherein the digital mirror device includes a plurality of pixel mirrors which rotate on a pixel rotation axis, and
wherein a focusing direction in which the two-dimensional pattern image is focused and the pixel rotation axis are parallel with each other.

8. The digital exposure system of claim 1, wherein the digital mirror device includes a plurality of pixel mirrors which rotate on a pixel rotation axis, and
wherein an inclination angle between a focusing direction in which the two-dimensional pattern image is focused and the pixel rotation axis is larger than 0° and smaller than 45°.

9. A digital exposure system comprising:
a light source that radiates light onto a substrate;
a digital mirror device that forms a two-dimensional pattern image by selectively transmitting light emitted from the light source;
an optical system that modulates the two-dimensional pattern image into a one-dimensional pattern image; and
a substrate scanner that adjusts the position of the substrate to continuously project the one-dimensional pattern image onto a photosensitive layer on the substrate for scan exposure,
wherein the two-dimensional pattern image has a uniform image in a direction parallel with a scan direction for the substrate and has an image of a target pattern in a direction perpendicular to the scan direction for the substrate,
wherein the digital mirror device includes a plurality of pixel mirrors which rotates on a pixel rotation axis, and
wherein a focusing direction in which the two-dimensional pattern image is focused and the pixel rotation axis are parallel with each other.

10. A digital exposure system comprising:
a light source that radiates light onto a substrate;
a digital mirror device that forms a two-dimensional pattern image by selectively transmitting light emitted from the light source;
an optical system that modulates the two-dimensional pattern image into a one-dimensional pattern image; and
a substrate scanner that adjusts the position of the substrate to continuously project the one-dimensional pattern image onto a photosensitive layer on the substrate for scan exposure,
wherein the two-dimensional pattern image has a uniform image in a direction parallel with a scan direction for the substrate and has an image of a target pattern in a direction perpendicular to the scan direction for the substrate,
wherein the digital mirror device includes a plurality of pixel mirrors which rotates on a pixel rotation axis, and
wherein an inclination angle between a focusing direction in which the two-dimensional pattern image is focused and the pixel rotation axis is larger than 0° and smaller than 45°.

* * * * *